United States Patent
Ogata et al.

(10) Patent No.: US 9,873,824 B2
(45) Date of Patent: Jan. 23, 2018

(54) ABRASIVE MATERIAL, METHOD FOR PRODUCING SAME, AND ABRASIVE SLURRY CONTAINING SAME

(71) Applicant: Mitsui Mining & Smelting Co., Ltd., Tokyo (JP)

(72) Inventors: Sumikazu Ogata, Tokyo (JP); Shigeki Tokuchi, Saitama (JP); Yohei Maruyama, Saitama (JP); Motomi Oshika, Saitama (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 15/021,434

(22) PCT Filed: Aug. 29, 2014

(86) PCT No.: PCT/JP2014/072781
§ 371 (c)(1),
(2) Date: Mar. 11, 2016

(87) PCT Pub. No.: WO2015/049942
PCT Pub. Date: Apr. 9, 2015

(65) Prior Publication Data
US 2016/0222265 A1 Aug. 4, 2016

(30) Foreign Application Priority Data

Oct. 3, 2013 (JP) .................. 2013-208660

(51) Int. Cl.
| | | |
|---|---|---|
| C09K 3/14 | (2006.01) | |
| C01G 45/02 | (2006.01) | |
| C09C 3/06 | (2006.01) | |
| B24B 37/00 | (2012.01) | |
| H01L 21/02 | (2006.01) | |
| C23C 18/12 | (2006.01) | |

(52) U.S. Cl.
CPC ............ *C09K 3/1463* (2013.01); *B24B 37/00* (2013.01); *C01G 45/02* (2013.01); *C09C 3/063* (2013.01); *C09K 3/1436* (2013.01); *C09K 3/1445* (2013.01); *C23C 18/1212* (2013.01); *C23C 18/1216* (2013.01); *C23C 18/1229* (2013.01); *H01L 21/02024* (2013.01); *C01P 2004/03* (2013.01); *C01P 2004/62* (2013.01); *C01P 2004/64* (2013.01); *C01P 2004/84* (2013.01)

(58) Field of Classification Search
CPC .... B32B 2255/04; C09K 13/00; C09K 15/02; C09K 3/14
See application file for complete search history.

(56) References Cited

U.S. PATENT DOCUMENTS

| | | | | |
|---|---|---|---|---|
| 4,152,712 A | * | 5/1979 | Myers ....................... | G09F 9/33 257/653 |
| 6,652,967 B2 | * | 11/2003 | Yadav ...................... | B01J 12/02 427/201 |
| 7,435,276 B2 | * | 10/2008 | Chen ....................... | B23D 61/18 428/403 |
| 2003/0186634 A1 | | 10/2003 | Nishida et al. | |
| 2010/0258528 A1 | * | 10/2010 | Singh ....................... | C09G 1/02 216/53 |
| 2012/0240478 A1 | | 9/2012 | Horiuchi et al. | |

FOREIGN PATENT DOCUMENTS

| | | |
|---|---|---|
| JP | 2003-277732 | 10/2003 |
| JP | 2011-121153 | 6/2011 |
| WO | WO 2013/035545 | 3/2013 |

OTHER PUBLICATIONS

International Search Report, PCT/JP2014/072781, dated Nov. 18, 2014.

\* cited by examiner

*Primary Examiner* — Pegah Parvini
(74) *Attorney, Agent, or Firm* — Young & Thompson

(57) ABSTRACT

A polishing material including polishing abrasive grains, the polishing abrasive grain having a core material that includes a metal oxide, and a cover layer that is provided on a surface of the core material and includes an oxide of a metal, that is different from the core material, or an oxide of a semimetal. When the polishing abrasive grains are observed with a scanning electron microscope after boiling a slurry including the polishing abrasive grains for 5 hours, a ratio of a longitudinal axis to a lateral axis of the polishing abrasive grain is 1.0 or greater and less than 1.5. The polishing abrasive grain preferably has a mass ratio of the cover layer to the core material, cover layer/core material, of from 0.3 mass % to 30 mass % inclusive. The cover layer preferably has a thickness of from 0.2 nm to 500 nm inclusive.

18 Claims, 3 Drawing Sheets

Example 1

Example 2

Comparative Example

ABRASIVE MATERIAL, METHOD FOR PRODUCING SAME, AND ABRASIVE SLURRY CONTAINING SAME

TECHNICAL FIELD

The present invention relates to a polishing material including polishing abrasive grains that include a metal oxide. The present invention also relates to a method for producing the polishing abrasive grains, and a polishing slurry including the polishing material.

BACKGROUND ART

There has been known a technique for improving the characteristics of polishing material particles by providing a cover layer on the surface of each polishing material particle. For example, Patent Literatures 1 and 2 propose polishing material particles having a core-shell structure and having an average particle size ranging from 5 to 300 nm. The shell part of this core-shell structure has a thickness ranging from 1 to 50 nm, and is constituted by a silica-based composite oxide including silica as a main component. The core part is made of MnO, $SiO_2$, $Al_2O_3$, $ZrO_2$, $SnO_2$, ZnO, $CeO_2$, or $TiO_2$. The technique disclosed in these literatures has the aim of preventing alkali metal from remaining on the polished substrate by trapping, with the shell part, the alkali metal included in the core part, and the aim of adjusting polishing characteristics by providing the shell part or by changing the components of the shell part.

CITATION LIST

Patent Literature

Patent Literature 1: JP 2003-277732 A
Patent Literature 2: US 2003/186634 A1

SUMMARY OF INVENTION

According to the technique disclosed in the aforementioned patent literatures, the thickness of the shell part is made relatively large with respect to the size of the core part in order to trap the alkali metal included in the core part, which is made e.g. of MnO, with the shell part. Stated differently, the shell part is made thick. This, however, may result in the weakening of the functions of the core part, which is the part that exhibits the main functions as a polishing material; thus, in some cases, the polishing rate may deteriorate, and satisfactory polishing properties may not be achieved.

Apart from the aforementioned technique, Inventors have found that, in cases where a manganese oxide-based compound is used as the polishing material, the deposition of dendritic manganese oxide crystals may unintentionally occur if the manganese oxide-based polishing material is made into a slurry and stored over a long period of time. Inventors have found, as a result of research, that such dendritic crystals are a cause of degradation in polishing performance.

The present invention provides a polishing material including polishing abrasive grains, the polishing abrasive grain having a core material that includes a metal oxide, and a cover layer that is provided on a surface of the core material and includes an oxide of a metal, that is different from the core material, or an oxide of a semimetal, wherein, when the polishing abrasive grains are observed with a scanning electron microscope after boiling a slurry including the polishing abrasive grains for 5 hours, a ratio of a longitudinal axis to a lateral axis of the polishing abrasive grain is 1.0 or greater and less than 1.5.

DESCRIPTION OF EMBODIMENTS

Figure 1:
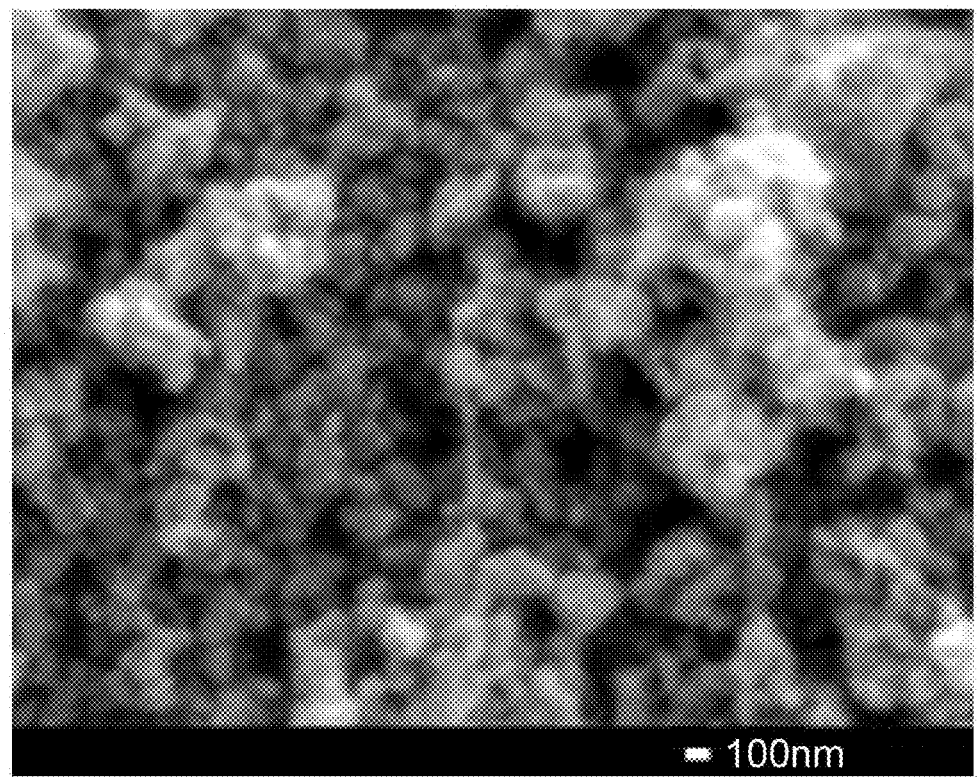
FIG. 1 is an electron microscope image of a polishing material obtained in Example 1.

The present invention is described below according to preferred embodiments thereof. The polishing material of the invention includes polishing abrasive grains each including a core material, and a cover layer that covers the surface of the core material. The core material is the main part of the polishing abrasive grain with which the polishing abrasive grain exhibits its polishing functions, and is located in the center region of the polishing abrasive grain. On the other hand, the cover layer is located on the outermost surface of the polishing abrasive grain. It is preferable that the core material and the cover layer are in direct contact with one another, but in some cases, one or more other layers may be interposed between the core material and the cover layer.

The core material includes a metal oxide, such as a manganese oxide or a cerium oxide. In this Description, the term "manganese oxide" broadly encompasses oxides of manganese. Concrete examples of manganese oxides include manganese (II) oxide (MnO), manganese (III) sesquioxide ($Mn_2O_3$), manganese dioxide ($MnO_2$), and trimanganese tetraoxide ($Mn_3O_4$). One type of the aforementioned manganese oxides may be used alone, or two or more types may be used in combination. Of these manganese oxides, it is suitable to use manganese dioxide $MnO_2$—which is a compound having particularly high oxidative power—because chemical-mechanical polishing (CMP) can be performed efficiently. In cases of using manganese dioxide, any one of manganese dioxide having a β-type crystal structure, manganese dioxide having a λ-type crystal structure, or manganese dioxide having a γ-type crystal structure may be used, or these may be used in combination. The core material may include oxides other than metal oxide(s), or may consist only of metal oxide(s).

In cases of using manganese dioxide as a manganese oxide, the manganese dioxide can be obtained by producing/depositing manganese dioxide on the surface of a positive electrode by an electrolytic reaction. The thus-produced manganese dioxide may be heated in a thermal atmosphere of from 200° C. to 600° C. inclusive. As another method, it is possible to employ a method for obtaining manganese dioxide by treating lithium manganate ($LiMn_2O_4$) or zinc manganate ($ZnMn_2O_4$) with a high-concentration acid and eluting the lithium or zinc.

The shape of the core material may affect the shape of the polishing abrasive grain. The reason for this is that the thickness of the cover layer in this polishing abrasive grain is relatively small with respect to the size of the core material as described further below, and therefore, the shape of the polishing abrasive grain tends to reflect the shape of the core material. The shape of the core material, as the shape of the polishing abrasive grain, may be angular or spherical.

The size of the core material may affect the polishing performance of the polishing abrasive grains. From this viewpoint, it is preferable that the average particle size of the core material as expressed in terms of volume-based cumulative particle size $D_{50}$, which is the particle size at 50 vol % in cumulative volume according to the laser diffraction/scattering-type particle size distribution measurement method, is from 0.08 µm to 3.0 µm inclusive, more preferably greater than 0.3 µm and less than or equal to 1.0 µm. An example of a means for adjusting the average particle size of the core material is dry grinding. Concrete examples of dry grinding include various pulverizers, such as: a jet mill that pulverizes particles by making high-pressure gas streams collide against one another; an atomizer that pulverizes particles by shearing force between a rotary blade and a screen; and a roller mill that pulverizes particles between two rollers.

The cover layer located on the surface of the core material includes an oxide of a metal, that is different from the core material, or an oxide of a semimetal. Examples of metals constituting such an oxide include aluminum, titanium, zirconium, iron, vanadium, chromium, yttrium, cerium, and lanthanum. Examples of semimetals include boron, silicon, germanium, arsenic, and antimony. Concrete examples of oxides include silica, alumina, titania, zirconia, or iron oxide. One type of the aforementioned oxides may be used alone, or two or more types may be used in combination. In cases where a manganese oxide is employed as the core material, it is preferable to use silica as the oxide, from the viewpoint of being able to prevent the generation of manganese oxide dendrites particularly effectively, and of being able to particularly improve the polishing rate.

The cover layer may cover the entire region of the surface of the core material uniformly and continuously, or may cover the surface of the core material in a discontinuous manner in a state where a portion of the surface is exposed. In cases of using a metal oxide as the core material, it is preferable that the cover layer covers the entire region of the surface of the core material uniformly and that the surface of the core material is not exposed to the outside, from the viewpoint of preventing the generation of metal oxide dendrites particularly effectively. The extent to which the core material is covered by the cover layer can be measured, for example, by elemental mapping by observing the polishing material with an electron microscope.

It is preferable that the oxide constituting the cover layer includes fine particles, and that the cover layer is formed by an aggregate in which the particles are closely aggregated. More specifically, it is preferable that the oxide constituting the cover layer includes fine particles having an average particle size of from 0.5 nm to 500 nm inclusive, more preferably from 2.0 nm to 300 nm inclusive. By forming the cover layer from an aggregate of fine particles, the formation of metal oxide dendrites can be prevented effectively in cases where a metal oxide is employed as the core material. Also, the polishing rate of the polishing material of the invention can be improved. The size of the oxide particle constituting the cover layer is measured by observing, under magnification, the polishing abrasive grains with an electron microscope. Twenty or more particles are measured, and the average of the particles measured is considered the size of the particle.

The thickness of the cover layer may be a factor that affects the characteristics of the polishing abrasive grains. More specifically, if the thickness of the cover layer is too small, then it becomes difficult to achieve the intended objective of the present invention, whereas if the thickness of the cover layer is too large, then it becomes difficult to give rise to the characteristics of the core material, and the polishing characteristic tends to deteriorate. From this viewpoint, it is preferable that the average thickness of the cover layer—i.e., the average value of the thickness of the cover layer including both covered and non-covered surfaces—is preferably from 0.2 nm to 500 nm inclusive, more preferably from 1.0 nm to 300 nm inclusive. The thickness of the cover layer can be directly measured by observing, under magnification, the polishing abrasive grains with an electron microscope. Alternatively, the thickness can be measured by elemental mapping by observing the polishing abrasive grains with an electron microscope. In either method, the thickness is measured at three points of a single particle within the field of view, and the average of the particles measured is considered the thickness of the cover layer.

The thickness of the cover layer is also related to the size of the core material. If the thickness of the cover layer is too small with respect to the size of the core material, then it becomes difficult to achieve the intended objective of the present invention, whereas if the thickness of the cover layer is too large with respect to the size of the core material, then it becomes difficult to give rise to the characteristics of the core material, and the polishing characteristic tends to deteriorate. From this viewpoint, it is preferable that the ratio of the cover layer's thickness (nm) to the core material's size (nm) (i.e., the cover layer's thickness (nm)/the core material's size (nm)) is preferably from 0.002 to 2.5 inclusive, more preferably 0.005 to 0.5 inclusive.

In relation to the thickness of the cover layer, the mass percentage of the cover layer in the polishing abrasive grain may be a factor that affects the characteristics of the polishing material. More specifically, if a mass ratio of the cover layer to the core material is too small, then it becomes difficult to achieve the intended objective of the present invention, whereas if the mass ratio of the cover layer to the core material is too large, then it becomes difficult to give rise to the characteristics of the core material, and the polishing characteristic tends to deteriorate. From this viewpoint, it is preferable that the polishing abrasive grain has the mass ratio of the cover layer to the core material, the cover layer/the core material, of preferably from 0.3 mass % to 30 mass % inclusive, more preferably from 0.5 mass % to 8 mass % inclusive. By setting this value (the mass of the cover layer/the mass of the core material) within the aforementioned range, the mass of the cover layer in the polishing abrasive grain can be made relatively low, and the core material's functions are exerted sufficiently. Further, in cases where a manganese oxide is used as the metal oxide, the provision of the cover layer effectively prevents the formation of manganese oxide dendrites.

The aforementioned value (the mass of the cover layer/the mass of the core material) is measured, for example, according to the following methods. One method is to first calculate the average mass of the core material, which is a raw material, from the average particle size and the density of the core material, and then find the aforementioned ratio from the amount (mass) of the coated cover layer. Alternatively, the aforementioned ratio can be found by: observing a polishing abrasive grain with a transmission electron microscope, and randomly measuring the cross section at five points to find the particle size and the average thickness of the cover layer; performing this measurement for 20 polishing abrasive grains, to calculate the average particle size and average cover layer thickness; determining the composition of the core material and the composition of the cover layer by EDX; and calculating the mass of the cover layer and the mass of the core material from the composition determination result, the specific gravities of the core material and the cover layer, the average particle size, and the average cover layer thickness.

It is preferable that the polishing abrasive grains has the average particle size $D_{50}$ of from 0.08 μm to 3.0 μm inclusive, more preferably from 0.3 μm to 1.0 μm inclusive. By setting the average particle size of the polishing abrasive grains within this range, it is possible to polish an object at a high polishing rate. The average particle size $D_{50}$ of the polishing abrasive grains refers to the volume-based cumulative particle size which is the particle size at 50 vol % in cumulative volume according to the laser diffraction/scattering-type particle size distribution measurement method.

The polishing abrasive grains have a non-acicular form wherein, when the polishing abrasive grains are observed with a scanning electron microscope (referred to hereinafter also as "SEM") after boiling a slurry including the polishing abrasive grains for 5 hours, a ratio of the longitudinal axis to the lateral axis of the polishing abrasive grain (i.e., longitudinal axis/lateral axis) is 1.0 or greater and less than 1.5. Stated differently, the polishing abrasive grain has an isotropic form wherein the aspect ratio, which is the ratio between the longitudinal axis and the lateral axis, is close to 1. Because the boiled polishing abrasive grains have a non-acicular form, the polishing material of the invention including these polishing abrasive grains has an increased polishing rate. Also, it is possible to effectively prevent the formation of dendritic manganese oxide crystals in cases where a manganese oxide is used as the core material of the polishing abrasive grain. In the present invention, the expression "the polishing abrasive grains have a non-acicular form" means that, when 20 or more boiled polishing abrasive grains are observed with an SEM, 70% or more (in terms of the number of grains) of the polishing abrasive grains have a non-acicular form. Thus, it is permissible if there are polishing abrasive grains having forms other than the non-acicular form among the boiled polishing abrasive grains. Pure water is used for boiling the polishing abrasive grains.

The aforementioned longitudinal axis refers to the lengthwise axis of the boiled polishing abrasive grain, and the lateral axis refers to the axis orthogonal to the longitudinal axis. The lengthwise axis refers to the longest line segment among line segments that transverse the boiled polishing abrasive grain.

The polishing material of the present invention may be dispersed in water or a water-based liquid, and be used as a polishing slurry. A "water-based liquid" refers to a liquid mixture of water and a water-soluble organic solvent. Examples of useful water-soluble organic solvents include alcohols and ketones. It is preferable that the percentage of the polishing material included in the polishing slurry is preferably from 0.2 mass % to 30.0 mass % inclusive, more preferably from 0.5 mass % to 20.0 mass % inclusive.

The polishing slurry may include other components in addition to the polishing material of the present invention. Examples of such components may include oxidizing agents and dispersing agents for the polishing material. However, because the surface of the core material of the present polishing abrasive grain is covered with an oxide cover layer, the polishing abrasive grains used in the present invention disperse into a liquid medium to a great extent, even without the addition of a dispersing agent. Thus, the polishing slurry preferably does not include any dispersing agent.

With the aforementioned polishing slurry, it is possible to polish an object-to-be-polished made of a high-hardness difficult-to-machine material, such as silicon carbide (SiC), at a high polishing speed with excellent surface accuracy.

Next, preferable methods for producing polishing abrasive grains usable in the present invention are described according to examples in which manganese oxide is used as the core material. The polishing abrasive grains are suitably produced by adding an acid or a base to a dispersion in which the core material—which consists of manganese oxide—is dispersed in an aqueous solution including a raw-material compound—which is a raw material of the cover layer—to cause hydrolysis of the raw-material compound, and to thereby deposit an oxide on the surface of the core material. The following describes examples in which the cover layer is silica.

In order to form a cover layer including silica, it is possible to use, for example, silicic acid or a silicate as a silica source. Examples of usable silicate include silicate of alkali metals, such as sodium silicate. In cases of using a silicate of an alkali metal as the silica source, a dispersion is obtained by dispersing a core material made of manganese oxide into an aqueous solution including the silicate of an alkali metal. An acid is added to this dispersion to adjust the pH and hydrolyze the silicic acid, and thereby silica is deposited on the surface of the core material.

In cases of using silicic acid ($H_2SiO_3$) as the silica source, a dispersion is obtained by dispersing a core material made of manganese oxide into an aqueous solution including silicic acid. A base is added to this dispersion to adjust the pH and hydrolyze the silicic acid, and thereby silica is deposited on the surface of the core material.

In cases where the cover layer includes e.g. alumina in addition to silica, an alumina source may be dissolved in the aqueous solution in addition to the silica source. Examples of alumina sources include sodium aluminate, aluminum chloride, etc.

In employing any one of the aforementioned methods, the thickness of the cover layer can be adjusted by increasing/decreasing, for example, the concentration of the silica source to be added, the liquid temperature, and/or the retention time. The particle size of the silica particles constituting the cover layer can be adjusted, for example, by adjusting the pH of the liquid by adding an acid or an alkali.

The aforementioned production methods relate to cases where the cover layer is made of silica, but even in cases where the cover layer includes other oxides, such as titania, zirconia, or iron oxide, polishing abrasive grains can be produced according to a similar procedure. In cases where the cover layer includes titania, titanium tetrachloride, for example, may be used as the raw-material compound. In cases where the cover layer includes zirconia, zirconium oxychloride, for example, may be used as the raw-material compound. In cases where the cover layer includes iron oxide, iron sulfate, for example, may be used as the raw-material compound.

EXAMPLES

The present invention is described in further detail below according to Examples. The scope of the present invention, however, is not limited to the Examples. Unless particularly described otherwise, "%" refers to "mass %".

Example 1

(1) Production of Polishing Abrasive Grains:

Manganese dioxide was deposited on a positive electrode by electrolytic decomposition of a manganese sulfate aqueous solution. The manganese dioxide was granulated with a granulator (Atomizer from Powrex Corporation), and then pulverized with a jet mill (PJM-200SP from Nippon Pneumatic Mfg. Co., Ltd.), to obtain manganese dioxide particles with an average particle size $D_{50}$ of 0.463 μm. These particles were used as the core material. The core material was dispersed in an aqueous solution including 0.0079 mol/L (in terms of Si) of sodium silicate, to obtain a dispersion. The percentage of the core material in the dispersion was 5%. To this dispersion, sulfuric acid was added as an acid and the pH of the dispersion was adjusted to 6.7, and thus a cover layer including silica was formed on the surface of the core material, to thereby obtain the intended polishing abrasive grains. The various physical properties of the polishing abrasive grains are shown in Table 1 below. For the laser diffraction/scattering-type particle size distribution measurement, LA-920 from Horiba, Ltd. was used.

(2) Production of Polishing Slurry:

The obtained polishing abrasive grains were dispersed in pure water, to obtain a polishing slurry. The percentage of the polishing material in the slurry was 2%. No dispersing agent was included in the slurry.

Example 2

The same core material as that used in Example 1 was used in this Example. The core material was dispersed in an aqueous solution including 0.0079 mol/L (in terms of Si) of silicic acid ($H_2SiO_3$), to obtain a dispersion. The percentage of the core material in the dispersion was 5%. To this dispersion, sodium hydroxide was added as a base and the pH of the dispersion was adjusted to 6.1, and thus a cover layer including silica was formed on the surface of the core material, to thereby obtain the intended polishing abrasive grains. The various physical properties of the polishing abrasive grains are shown in Table 1 below. A polishing slurry was obtained in the same way as in Example 1, except for the points described above.

Example 3

The same core material as that used in Example 1 was used in this Example. The core material was dispersed in an aqueous solution including 0.0040 mol/L (in terms of Si) of silicic acid ($H_2SiO_3$), to obtain a dispersion. The percentage of the core material in the dispersion was 5%. To this dispersion, sodium hydroxide was added as a base and the pH of the dispersion was adjusted to 6.1, and thus a cover layer including silica was formed on the surface of the core material, to thereby obtain the intended polishing abrasive grains. The various physical properties of the polishing abrasive grains are shown in Table 1 below. A polishing slurry was obtained in the same way as in Example 1, except for the points described above.

Example 4

The same core material as that used in Example 1 was used in this Example. The core material was dispersed in an aqueous solution including 0.0119 mol/L (in terms of Si) of silicic acid ($H_2SiO_3$), to obtain a dispersion. The percentage of the core material in the dispersion was 5%. To this dispersion, sodium hydroxide was added as a base and the pH of the dispersion was adjusted to 6.1, and thus a cover layer including silica was formed on the surface of the core material, to thereby obtain the intended polishing abrasive grains. The various physical properties of the polishing abrasive grains are shown in Table 1 below. A polishing slurry was obtained in the same way as in Example 1, except for the points described above.

Example 5

Manganese dioxide particles that were produced according to the same steps as the core material used in Example 1 and that had an average particle size $D_{50}$ of 0.447 μm were used as the core material. The core material was dispersed in an aqueous solution including 0.0079 mol/L (in terms of Si) of sodium silicate and 0.0012 mol/L (in terms of Al) of aluminum silicate, to obtain a dispersion. The percentage of the core material in the dispersion was 5%. To this dispersion, sulfuric acid was added as an acid and the pH of the dispersion was adjusted to 6.8, and thus a cover layer including silica and alumina was formed on the surface of the core material, to thereby obtain the intended polishing material. The various physical properties of the polishing material are shown in Table 1 below. A polishing slurry was obtained in the same way as in Example 1, except for the points described above. As regards the ratio between silica and alumina, the percentage of alumina (in terms of Al) was 25% to silica (in terms of Si).

Example 6

The same core material as that used in Example 5 was used in this Example. The core material was dispersed in an aqueous solution including 0.0079 mol/L (in terms of Si) of silicic acid ($H_2SiO_3$) and 0.0012 mol/L (in terms of Al) of aluminum silicate, to obtain a dispersion. The percentage of the core material in the dispersion was 5%. To this dispersion, sodium hydroxide was added as a base and the pH of the dispersion was adjusted to 6.5, and thus a cover layer including silica and alumina was formed on the surface of the core material, to thereby obtain the intended polishing material. The various physical properties of the polishing material are shown in Table 1 below. A polishing slurry was obtained in the same way as in Example 1, except for the points described above. As regards the ratio between silica and alumina, the percentage of alumina (in terms of Al) was 25% to silica (in terms of Si).

Comparative Example 1

The core material used in Example 1 was used as-is as the polishing abrasive grains without forming a cover layer thereon. A polishing slurry was obtained in the same way as in Example 1, except for the point described above.

Evaluation 1:

Each of the polishing slurries obtained in the respective Examples and Comparative Example was used to polish a SiC wafer. A lapped 2-inch-dia. 4H—SiC substrate was used as the object to be polished. The Si surface of the substrate was subjected to polishing. A single-surface polisher BC-15 from MAT Inc. was used as the polishing device. SUBA #600 from Nitta Haas Incorporated was used as the polishing pad to be attached to the surface plate. The rotation speed of the surface plate was set to 60 rpm, and the outer periphery speed was set to 7163 cm/min. The carrier rotation speed was set to 60 rpm, and the outer periphery speed was set to 961 cm/min. Chemical-mechanical polishing (CMP) was performed by supplying each polishing slurry at a rate of 0.2 L/min, and applying a load of 3 psi in this state. The polishing time was 2 hours. The polishing rate (nm/min) was calculated from the difference in mass of the wafer before and after polishing and the density of SiC (3.10 g/cm$^3$). The results are shown in Table 1.

Figure 2:
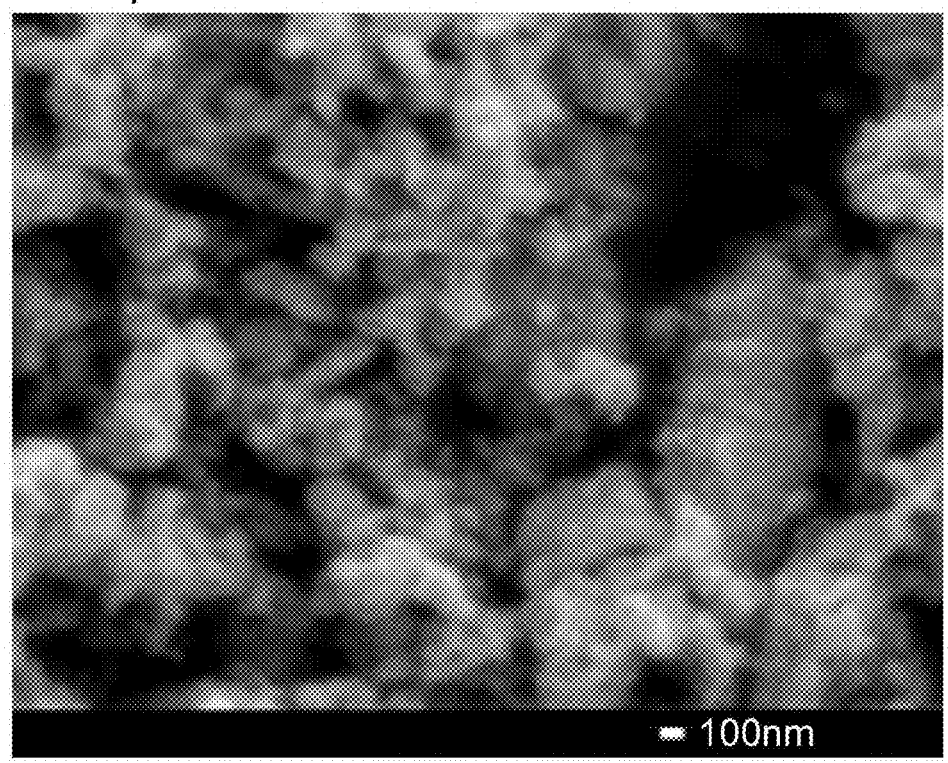
FIG. 2 is an electron microscope image of a polishing material obtained in Example 2.
Figure 3:
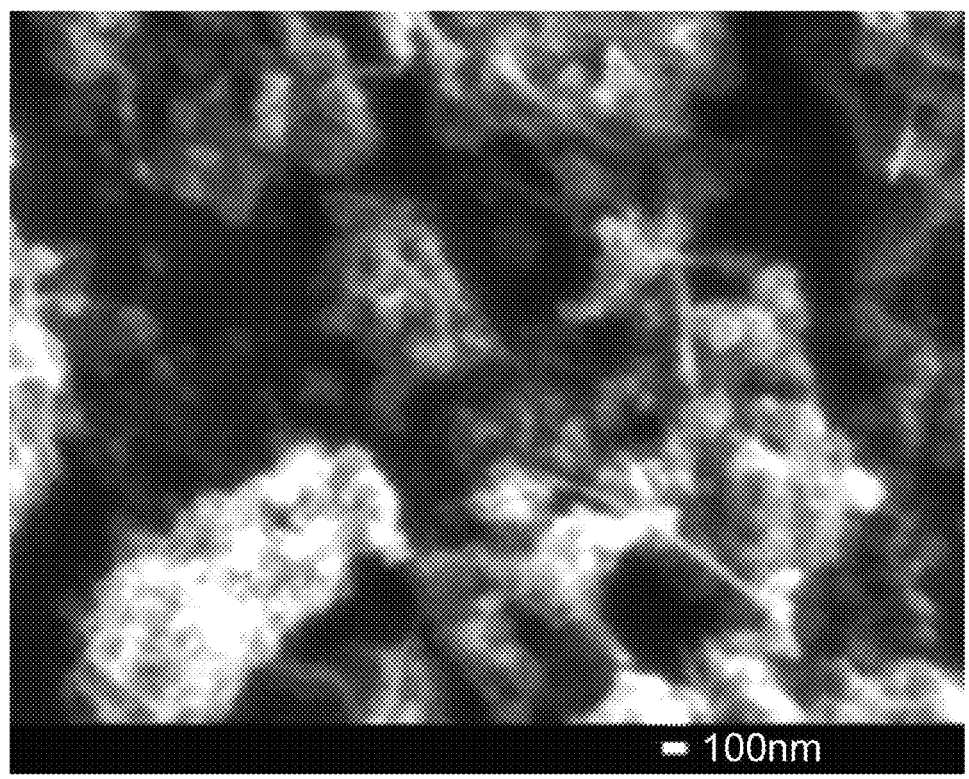
FIG. 3 is an electron microscope image of a polishing material obtained in Comparative Example 1.

Evaluation 2:

The polishing slurries obtained in Examples 1 and 2 and Comparative Example 1 were stored for 21 days in a constant temperature oven kept at 50° C. The state of the polishing abrasive grains in each polishing slurry after storage was observed with a scanning electron microscope, to see whether dendrites were formed. The results are shown in Table 1 and in FIGS. 1 to 3.

The evaluation in Table 1 regarding the formation of dendrites was determined by observing how many dendrites there were in a single 4×3 μm field of view at the time of measuring the longitudinal-axis-to-lateral-axis ratio of the polishing abrasive grain by observing the grains with an SEM.

greater—were observed per single field of view when observation within a 4×3 μm field of view was performed at 10 sites. That is, in Comparative Example 1, a greater number of acicular polishing abrasive grains were observed, and the percentage of the number of non-acicular polishing abrasive grains to the number of polishing abrasive grains observed was 57% or less. Further, compared to Comparative Example 1, Example 1 clearly exhibited a higher polishing rate at the time of polishing a SiC wafer.

INDUSTRIAL APPLICABILITY

The present invention provides a polishing material having an improved polishing rate. Also, in cases where the polishing abrasive grains included in the polishing material include manganese oxide, the formation of dendritic manganese oxide crystals can be prevented effectively.

The invention claimed is:

1. A polishing material comprising polishing abrasive grains, the polishing abrasive grain having a core material that includes a metal oxide comprising a manganese oxide, and a cover layer that is provided on a surface of the core material and includes an oxide of a metal comprising silica, that is different from the core material, wherein

TABLE 1

|  | Example 1 | Example 2 | Example 3 | Example 4 | Example 5 | Example 6 | Comp. Example 1 |
|---|---|---|---|---|---|---|---|
| Average particle size $D_{50}$ of core material (μm) | 0.463 | 0.463 | 0.463 | 0.463 | 0.447 | 0.447 | 0.463 |
| Type of cover layer | SiO$_2$ | SiO$_2$ | SiO$_2$ | SiO$_2$ | SiO$_2$/Al$_2$O$_3$ | SiO$_2$/Al$_2$O$_3$ | None |
| Average particle size of polishing abrasive grain after covering (μm) | 0.4933 | 0.5119 | 0.5671 | 0.7418 | 0.5881 | 0.7122 | — |
| Cover layer thickness (nm) | 2.194 | 2.273 | 1.136 | 3.409 | 2.273 | 2.752 | — |
| Ratio between cover layer thickness (nm)/core material's average particle size (nm) | 0.0047 | 0.0049 | 0.0025 | 0.0074 | 0.0051 | 0.0062 | — |
| Mass ratio between cover layer/core material | 0.01 | 0.01 | 0.005 | 0.015 | 0.010 | 0.010 | — |
| Molar ratio between cover layer/core material | 0.0145 | 0.0145 | 0.00725 | 0.0218 | 0.0145 | 0.0145 | — |
| Polishing rate (nm/min) | 14.19 | 14.23 | 14.06 | 13.68 | 14.02 | 13.86 | 11.47 |
| Formation of dendrites (per single field of view) | ○* | ○* | ○* | ○* | ○* | ○* | X** |

*3 or fewer per single field of view
**10 or more per single field of view

As is clear from the results shown in Table 1, it is understood that, by polishing a SiC wafer by using a polishing slurry including a polishing material obtained according to one of the Examples, the polishing rate is higher compared to the case where the wafer is polished by using the polishing slurry including the polishing material obtained according to the Comparative Example. Further, as is clear from the result shown in FIG. 1, in the polishing materials obtained according to Examples 1 and 2, no dendritic crystals, or only very few dendritic crystals, were observed.

Apart from the aforementioned evaluations, the polishing abrasive grains used in Example 1 and Comparative Example 1 were boiled for 5 hours, and the respective polishing abrasive grains were observed with an SEM to measure the ratio between the longitudinal axis and the lateral axis. In Example 1, five or fewer grains having an acicular form—in which the aforementioned ratio was 1.5 or greater—were observed per single field of view when observation within a 4×3 μm field of view was performed at 10 sites. The percentage of the number of non-acicular polishing abrasive grains to the number of polishing abrasive grains observed was 74% or higher. In contrast, in Comparative Example 1, nine or more grains having an acicular form—in which the aforementioned ratio was 1.5 or a ratio of a longitudinal axis to a lateral axis of the polishing abrasive grain is 1.0 or greater and less than 1.5,
the cover layer covers an entire region of the surface of the core material completely, and
the manganese oxide is manganese dioxide (MnO$_2$) having a β-crystal structure, manganese dioxide (MnO$_2$) having a λ-crystal structure, or manganese dioxide (MnO$_2$) having a γ-crystal structure.

2. The polishing material according to claim 1, wherein the polishing abrasive grain has a mass ratio of the cover layer to the core material, cover layer/core material, of from 0.3 mass % to 30 mass % inclusive.

3. The polishing material according to claim 1, wherein the cover layer has a thickness of from 0.2 nm to 500 nm inclusive.

4. The polishing material according to claim 1, having an average particle size $D_{50}$ of from 0.08 μm to 3.0 μm inclusive.

5. The polishing material according to claim 1, wherein the polishing material is used for polishing SiC.

6. A polishing slurry comprising the polishing material according to claim 1.

7. A method for producing polishing abrasive grains of claim 1, wherein the method comprises depositing SiO$_2$ on the surface of the core material by adding an acid to a dispersion in which the core material including the metal oxide is dispersed in an aqueous solution including a silicate of an alkali metal.

8. A method for producing polishing abrasive grains of claim 1, wherein the method comprises depositing SiO$_2$ on the surface of the core material by adding a base to a dispersion in which the core material including the metal oxide is dispersed in an aqueous solution including silicic acid.

9. The polishing material according to claim 2, wherein the cover layer has a thickness of from 0.2 nm to 500 nm inclusive.

10. The polishing material according to claim 2, having an average particle size D$_{50}$ of from 0.08 μm to 3.0 μm inclusive.

11. The polishing material according to claim 3, having an average particle size D$_{50}$ of from 0.08 μm to 3.0 μm inclusive.

12. The polishing material according to claim 1, wherein the oxide included in the cover layer further comprises alumina, titania, zirconia, or an iron oxide.

13. The polishing material according to claim 2, wherein the oxide included in the cover layer further comprises alumina, titania, zirconia, or an iron oxide.

14. The polishing material according to claim 3, wherein the oxide included in the cover layer further comprises alumina, titania, zirconia, or an iron oxide.

15. The polishing material according to claim 4, wherein the oxide included in the cover layer further comprises alumina, titania, zirconia, or an iron oxide.

16. The polishing material according to claim 1, wherein the manganese oxide is selected from the group consisting of manganese (II) oxide (MnO), manganese (III) sesquioxide (Mn$_2$O$_3$), manganese dioxide (MnO$_2$), and trimanganese tetraoxide (Mn$_3$O$_4$).

17. The polishing material according to claim 1, wherein 70% or more, in terms of the number of grains, of the polishing abrasive grains have a non-acicular form.

18. A method for producing a silicon carbide substrate, comprising:

polishing the silicon carbide substrate with the polishing material according to claim 1.

\* \* \* \* \*